(12) United States Patent
Palacios Laloy

(10) Patent No.: US 11,614,472 B2
(45) Date of Patent: Mar. 28, 2023

(54) CURRENT SENSOR BASED ON THE FARADAY EFFECT IN AN ATOMIC GAS

(71) Applicant: COMMISSARIAT A L'ENERGIE ATOMIQUE ET AUX ENERGIES ALTERNATIVES, Paris (FR)

(72) Inventor: Agustin Palacios Laloy, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 30 days.

(21) Appl. No.: 17/307,329

(22) Filed: May 4, 2021

(65) Prior Publication Data

US 2021/0396786 A1    Dec. 23, 2021

(30) Foreign Application Priority Data

May 6, 2020    (FR) ...................... 20 04486

(51) Int. Cl.
*G01R 15/24* (2006.01)
*G01R 19/00* (2006.01)

(52) U.S. Cl.
CPC ....... *G01R 15/246* (2013.01); *G01R 19/0092* (2013.01)

(58) Field of Classification Search
CPC .............. G01R 15/246; G01R 33/0322; G01R 19/0092
See application file for complete search history.

(56) References Cited

U.S. PATENT DOCUMENTS

| | | | |
|---|---|---|---|
| 4,564,754 A * | 1/1986 | Sato ...................... | G01R 15/246 250/225 |
| 4,694,243 A * | 9/1987 | Miller ..................... | G01D 5/344 324/96 |
| 5,805,558 A * | 9/1998 | Kimura ............. | G11B 11/10543 369/116 |
| 6,114,846 A | 9/2000 | Bosselmann et al. | |
| 6,154,022 A | 11/2000 | Willsch et al. | |
| 7,180,657 B1 * | 2/2007 | Shevy .................... | H01S 3/1303 385/125 |
| 10,845,438 B2 | 11/2020 | Palacios Laloy | |
| 2004/0095570 A1 * | 5/2004 | Stanimirov .......... | G01R 15/247 356/128 |
| 2010/0097606 A1 * | 4/2010 | Kemp .................... | G01D 5/345 356/367 |

(Continued)

FOREIGN PATENT DOCUMENTS

| | | |
|---|---|---|
| EP | 3 524 990 A1 | 8/2019 |
| FR | 3 062 922 A1 | 8/2018 |

(Continued)

OTHER PUBLICATIONS

U.S. Appl. No. 16/511,298, filed Jul. 15, 2019, 2020/0018802 A1, Palacios Laloy, A, et al.
U.S. Appl. No. 16/675,828, filed Nov. 6, 2019, 2020/0150196 A1, Beato, F, et al.

(Continued)

*Primary Examiner* — Dominic E Hawkins
(74) *Attorney, Agent, or Firm* — Oblon, McClelland, Maier & Neustadt, L.L.P.

(57) ABSTRACT

A magneto-optical sensor for sensing a current flowing through a conductor includes a light source capable of providing a linearly-polarised optical beam, and a polarisation analyser configured to perform a differential measurement of two polarisation components of the linearly-polarised optical beam having travelled along an optical path arranged between the light source and the polarisation analyser. The optical path forms a closed trajectory around the conductor. The sensor comprises a cell containing an atomic gas arranged along the optical path.

13 Claims, 1 Drawing Sheet

(56) References Cited

U.S. PATENT DOCUMENTS

| | | | |
|---|---|---|---|
| 2012/0212375 A1* | 8/2012 | Depree, IV | H01Q 15/0086 |
| | | | 977/762 |
| 2013/0093421 A1 | 4/2013 | Ueno et al. | |
| 2015/0115934 A1* | 4/2015 | Mueller | G01R 15/247 |
| | | | 324/96 |
| 2016/0139216 A1 | 5/2016 | Ueno et al. | |
| 2019/0011491 A1* | 1/2019 | Raghavan | G01J 3/00 |
| 2019/0250223 A1 | 8/2019 | Palacios Laloy | |
| 2020/0408855 A1 | 12/2020 | Renon et al. | |

FOREIGN PATENT DOCUMENTS

| | | |
|---|---|---|
| KR | 10-1633500 B1 | 7/2016 |
| WO | WO 2019/122693 A1 | 6/2019 |

OTHER PUBLICATIONS

U.S. Appl. No. 16/723,096, filed Dec. 20, 2019, 2020/0200839 A1, Palacios Laloy, A, et al.
U.S. Appl. No. 16/801,282, filed Feb. 26, 2020, 2020/0278404 A1, Lieb, G, et al.
U.S. Appl. No. 16/812,664, filed Mar. 9, 2020, 2020/0292639 A1, Le Prado, M, et al.
U.S. Appl. No. 16/939,444, filed Jul. 27, 2020, 2021/0033686 A1, Garces Malonda, R, et al.
French Preliminary Search Report dated Dec. 23, 2020 in French Application 20 04486 filed on May 6, 2020, 3pages (with English Translation of Categories of Cited Documents).

* cited by examiner

CURRENT SENSOR BASED ON THE FARADAY EFFECT IN AN ATOMIC GAS

TECHNICAL FIELD

The field of the invention is that of measuring electrical currents by means of light wave propagation under the influence of the Faraday effect around a conductor.

PRIOR ART

The accurate and contactless measurement of medium currents (less than 1,000 or 1,500 A) is desirable, in particular for electrical systems including Li-ion batteries, for example in the field of aeronautics or in that of smart grids capable of mobilising connected storage capacities, such as automotive batteries.

Such a contactless measurement firstly creates the possibility of installing and removing the current sensors, for example for maintenance, without having to shut down the current to the circuit being measured. It also has the advantage of there being no galvanic contacts between the current sensor and the circuit whose current is being measured thereby. These contacts are often subject to gradual ageing which causes the electrical resistance thereof to increase over time, resulting in undesirable losses by Joule effect as well as measurement errors which increase over time and require periodic re-calibration of the current sensors.

Li-ion batteries have substantial advantages, in particular in terms of storage capacities, but do not show any significant voltage change over their discharge curve. Thus, unlike other batteries, the charge whereof can be reliably estimated by an immediate voltage measurement, the voltage measurement provides no indication on the state of charge of a Li-ion battery. To estimate the charge of such a battery, the currents flowing into and out of the battery must thus be measured and integrated over time. Any inaccuracy in this measurement, in particular any significant zero drift, results in large charge estimation errors, since these errors are integrated over times which, for many applications, can equal several days. It is thus important to have very good current measurement accuracies (in the order of $1/1,000$ or even $1/10,000$), and in particular an immunity of the measurement read on a sensor to currents other than the current being measured (for example, other batteries present in the electrical core of an aircraft or other vehicles being recharged in the vicinity of the vehicle whose battery is equipped with the current sensor in question).

A current measurement I that is completely insensitive to external currents can be obtained by Ampere's integral law $$I = \frac{1}{\mu_0} \oint_C \vec{B} \cdot \vec{dl},$$

where C is a closed contour around the current line to be measured and where all current lines that are not to be measured are outside this contour.

Different types of sensors have attempted to measure the right-hand side of this equation. For example, in cases where symmetries are present, the integral can be approximated by a sum of individual measurements of the magnetic field $\vec{B}$ tangential to the trajectory considered. A flux concentrator made of ferromagnetic material in the shape of a discontinuous torus can also be used. Almost all of the flux created by the currents inside the concentrator are thus concentrated at the air gap and an individual measurement in this region gives a good estimate of the Ampere integral provided that the field lines normal to the surface of the missing fraction of the torus have a negligible intensity. This principle is implemented in particular in current measurements using Hall effect sensors coupled to flux concentrators.

Another solution for measuring the Ampere integral is based on a magneto-optic effect, in this case the Faraday effect, which consists of rotating the plane of polarisation of the light by an angle φ proportional to the magnetic field longitudinal to the propagation of this light. In the presence of an inhomogeneous magnetic field, the total angle of rotation of this plane of polarisation is written as $\varphi = \mathcal{V} \oint_c \vec{B} \cdot \vec{dl}$, where $\mathcal{V}$ is a constant dependent on the material and the wavelength of the light and is called the Verdet constant. Since this curvilinear integral is strictly proportional to the Ampere integral, the current can be directly measured by rotating the polarisation of a light propagating along a closed trajectory around the conductor in which the current to be measured is propagating, with a constant of proportionality that can be determined either by a calculation or by a prior calibration.

This magneto-optic effect is, for example, used by FOCS (Fibre-Optic Current Sensors), which have an optical fibre positioned such that it surrounds the current line. Such sensors have remarkable accuracy (more than $1/1,000$) but, due to the low Verdet constant of the fibres, they are designed to measure high currents (500 kA nominal current for example). Furthermore, the mechanical stabilisation of the fibre (against vibrations, ageing, plasticity, etc. to prevent opto-mechanical effects from interfering with the measurement) is delicate due to the fact that the material media are inevitably subject to drift over time and to their varying behaviour.

DESCRIPTION OF THE INVENTION

The purpose of the invention is to provide a current sensor using the Faraday rotation which does not suffer from the aforementioned drawbacks of fibre-optic sensors and which is suitable in particular for measuring medium currents. For this purpose, the invention proposes a magneto-optical sensor for sensing a current flowing through a conductor, comprising:
  a light source capable of providing a linearly-polarised optical beam,
  a polarisation analyser configured to perform a differential measurement of two polarisation components of the linearly-polarised optical beam having travelled along an optical path arranged between the light source and the polarisation analyser, said optical path forming a closed trajectory around the conductor.

The sensor further comprises a cell containing an atomic gas which is arranged along the optical path.

Some preferred, however non-limiting aspects of this current sensor are as follows:
  the optical beam provided by the optical source is shifted in wavelength from the centre of an atomic transition line of the atomic gas;
  the optical beam provided by the optical source is shifted in wavelength from the centre of the atomic transition line by half the full width at half maximum of said line;
  the atomic gas is helium-4 and said line is the D2 line;
  it further comprises a modulator modulating the wavelength of the optical beam provided by the light source and a light source servo-control system configured for maintaining the shift in wavelength of the optical beam from the centre of said line;

it further comprises a modulator configured to modulate the amplitude or the frequency of the optical beam provided by the light source;

it comprises mirrors arranged along the optical path;

the cell is annular;

the polarisation analyser is a linear polarisation analyser configured to perform a differential measurement of a vertical polarisation component and of a horizontal polarisation component of the optical beam that has travelled along the optical path;

the linear polarisation analyser comprises a polarisation splitter capable of splitting the vertical polarisation component and the horizontal polarisation component on a first and a second path, and a photodetector on each of the first and second paths;

the polarisation analyser is a circular polarisation analyser configured to perform a differential measurement of a right-hand circular polarisation component and of a left-hand circular polarisation component of the optical beam that has travelled along the optical path;

the circular polarisation analyser comprises a quarter-wave plate, a polarisation splitter capable of splitting the right-hand circular polarisation component and the left-hand circular polarisation component on a first and a second path, and a photodetector on each of the first and second paths.

BRIEF DESCRIPTION OF THE FIGURES

Other aspects, purposes, advantages and features of the invention will be better understood upon reading the following detailed description given of the non-limiting preferred embodiments of the invention, provided for illustration purposes, with reference to the accompanying drawings, in which.

DETAILED DESCRIPTION OF THE EMBODIMENTS

The invention proposes a magneto-optical sensor for sensing a current flowing through a conductor. This sensor performs a current measurement by means of a light beam propagating along a closed trajectory surrounding the conductor, said measurement being based on the Faraday rotation (rotation of the plane of polarisation of the light) not in a solid-state medium but in an atomic gas, for example metastable helium-4 or an alkali.

Figure 1:
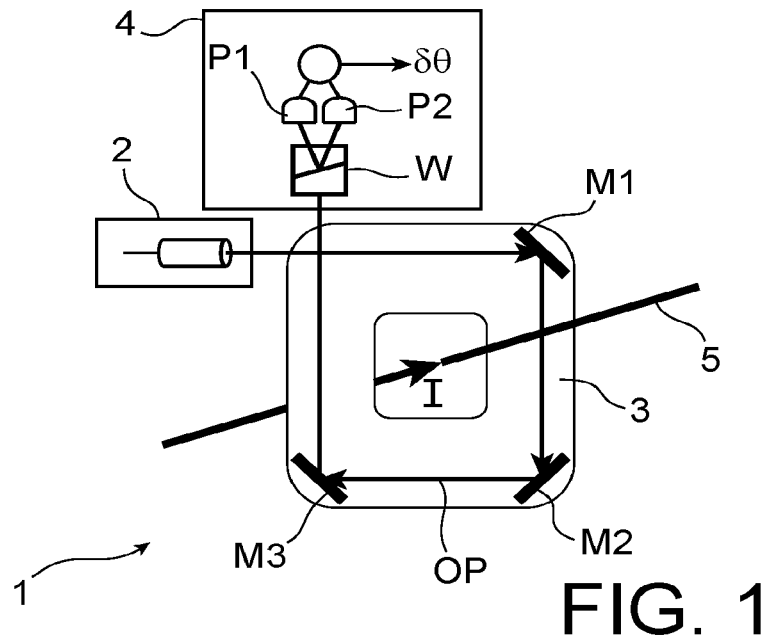
FIG. 1 is a diagram of a magnetometer according to a first example embodiment of the invention.
Figure 2:
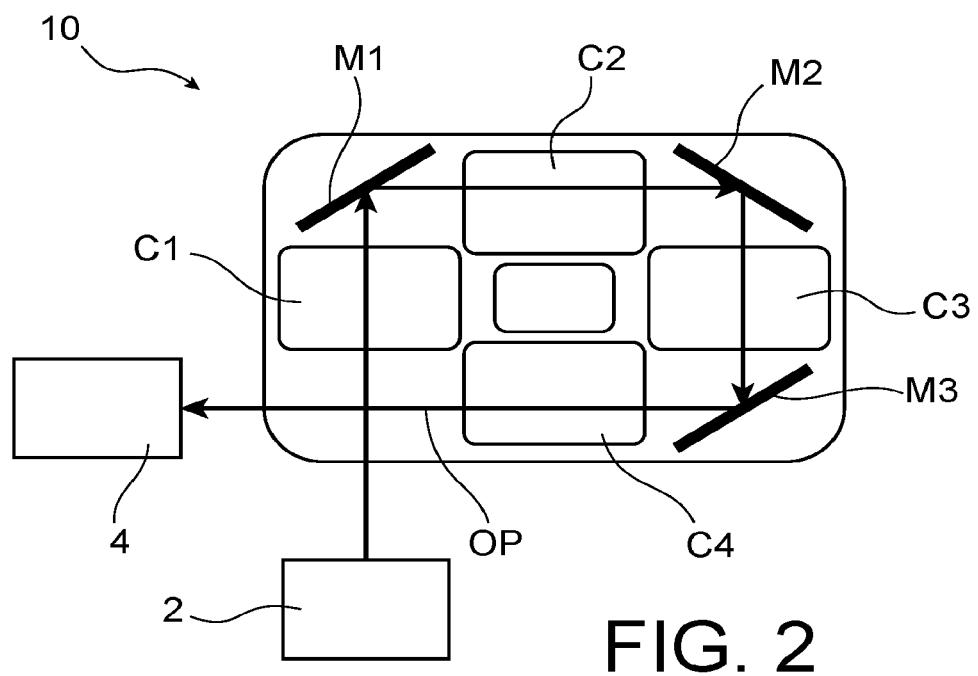
FIG. 2 is a diagram of a magnetometer according to a second example embodiment of the invention.

With reference to FIGS. 1 and 2, the invention thus relates to a magneto-optical sensor 1, 10 of a current I flowing through a conductor 5, said sensor comprising:

a light source 2 capable of providing a linearly-polarised optical beam, and, a polarisation analyser 4 configured to perform a differential measurement of two polarisation components of the linearly-polarised optical beam having travelled along an optical path OP arranged between the light source and the polarisation analyser, said optical path forming a closed trajectory around the conductor 5.

In the sensor according to the invention, at least one cell 3, C1-C4 containing an atomic gas is arranged along the optical path. The atomic gas is thus present along the trajectory of the optical beam on the optical path OP surrounding the conductor. The atomic gas is preferably present along the entire optical path OP, optionally with one or more regions of discontinuity, the accumulated length whereof is negligible (for example less than 1% or 1‰) compared to the total length of the optical path OP.

As shown in FIG. 1, the atomic gas forming the sensing element of the sensor according to the invention can be enclosed in an annular cell 3 in the centre whereof passes, when in use, the conductor 5 in which the current I to be measured flows. The annular cell can be equipped with deflecting mirrors M1-M3 allowing the incident light to follow a closed trajectory and exit the cell at an exit point which is, for example, close to the entry point of the optical path.

Alternatively, as shown in FIG. 2, the sensor can include a plurality of cells C1-C4, for example four cells, arranged along the optical path OP and deflecting mirrors M1-M3 allowing light to pass through each of the cells C1-C4 by travelling the closed trajectory around the conductor. In this alternative embodiment, the length of the regions of discontinuity separating the cells is not negligible as understood above. As a result, this sensor has measurement imperfections. However, when using specific configurations, geometric considerations can correct these measurement imperfections.

Each cell 3, C1-C4 contains an atomic species that is sensitive to the magnetic field: this can be, for example, a glass cell containing helium-4 atoms brought to its metastable state by excitation means well known in the field, a glass cell containing alkali atoms having a significant density in the gas phase as a result of heating to a temperature above ambient temperature, or a diamond crystal containing nitrogen impurities known as NV centres in the literature.

The light source 2 can comprise a laser diode capable of emitting the optical beam, said beam being linearly polarised (for example with a spurious polarisation rejection rate greater than 25 dB) by means of a polariser interposed between the laser diode and the optical path or directly integrated into the laser diode 2. The light source 2 can further comprise a collimator for fixing the direction of incidence of the optical beam to the entry point of the optical path OP.

At the end of the optical path OP, the polarisation change of the optical beam is analysed by a linear or circular analyser. More specifically, the polarisation rotation in the case of a circular analyser, or the change in ellipticity in the case of a circular analyser, is analysed since it is proportional to the current flowing through the conductor.

According to a first alternative embodiment, the polarisation analyser is a linear polarisation analyser configured to perform a differential measurement of a vertical polarisation component and of a horizontal polarisation component of the optical beam that has travelled along the optical path. As shown in FIG. 1, the linear polarisation analyser can comprise a polarisation splitter W, for example a Wollaston prism, capable of splitting the vertical polarisation component and the horizontal polarisation component on a first and a second path, and a photodetector P1, P2 on each of the first and second paths. The two photodetectors P1, P2 are used to measure the ratio between the powers of the two linear polarisations whose axes correspond to those of the splitter prism.

According to this alternative embodiment, the polarisation of the transmitted light is at 45° to the axis of symmetry of the annular cell, which will be described hereafter as the vertical direction. Upon exiting the cell, the light is analysed for polarisation using a splitter prism. The vertically polarised component and the horizontally polarised component are photodetected by two photodiodes connected to transimpedance amplifiers, at the output whereof the signals $V_{vert}$ and $V_{horiz}$ are respectively obtained. The rotation angle of the polarisation can be deduced from these two voltages by the equation $$\delta\theta = \frac{V_{vert} - V_{horiz}}{2(V_{vert} + V_{horiz})}.$$

When the wavelength of the light is placed such that it is detuned by half a linewidth from an atomic transition, for example $D_0$ or $D_2$ in the case of helium, this rotation angle $\delta\theta$ is strictly proportional to the current flowing through the conductor, and has no significant dependence on the fields and currents located in the vicinity of the sensor that are not flowing through the central hole of the annular cell.

According to a second alternative embodiment, the polarisation analyser is a circular polarisation analyser configured to perform a differential measurement of a right-hand circular polarisation component and of a left-hand circular polarisation component of the optical beam that has travelled along the optical path. The circular polarisation analyser can comprise a quarter-wave retarder plate, which precedes a polarisation splitter capable of splitting the right-hand circular polarisation component and the left-hand circular polarisation component on a first and a second path, and a photodetector on each of the first and second paths. The fast axis forms a 45° angle with the analysis axis of the separator.

In atomic physics, and in particular in optically-pumped magnetometry, the terminology "Faraday effect" is commonly used to refer to optical measurements of atomic states made with linearly-polarised light shifted in wavelength from a given optical transition. The plane of polarisation of this light thus undergoes a rotation that is dependent on the atomic state, in more concrete terms, that is proportional to the mean value of the magnetic moment component of the atoms along the propagation trajectory of the light.

It should be noted, however, that this does not correspond to the Faraday effect discussed in the introduction, where the rotation of the plane of polarisation is linked to the magnetic field and not to the magnetisation of the medium. However, in the most common magnetometer configurations (double-resonance magnetometer, Hanle-effect magnetometer), the magnetic moments of the atoms allow the field to be measured only because of the torque that this field exerts thereon. In order for this torque not to be zero, the direction of the magnetic field must not, in any case, be parallel to that of the magnetic moments, and thus in this case, this cannot be strictly speaking described as the Faraday effect except through misuse of language.

However, a magnetometry technique exists known as NMOR (Non-linear Magneto-Optical Rotation), where a phenomenon substantially equivalent to the Faraday effect stricto sensu appears on an atomic gas. This technique is characterised by the following elements:

- a cell filled with an atomic medium, consisting, according to the literature, of alkali atoms, is subjected to a single, linearly-polarised optical beam, tuned to the wavelength of an atomic transition, or very close thereto, with optical intensities that are lower than those which saturate the optical transition (as understood with regard to stimulated emission), but similar to or greater than those which allow the rate of optical pumping to be similar to or greater than the rate of relaxation of the atomic polarisation of the low level of the optical pumping cycle;
- the light is analysed by a linear polarisation analyser when exiting the cell, which allows the rotation of the plane of polarisation to be measured.

In this magnetometry technique, three magneto-optic effects appear, depending on the shift between the wavelength of the light and that of the atomic transition considered:

- a linear Faraday effect over a wide range of wavelengths around the transition;
- in the immediate vicinity of the transition (less than half a linewidth), the following add to this first effect:
- the Macaluso-Corbino effect, which gives rise to rotations of the polarisation having a non-monotonic dependence on the magnetic field;
- NMOR resonance, the only one actually used for measurements in the literature because it has a very steep slope in the ratio of the rotation of the polarisation to the longitudinal magnetic field.

However, the Applicant has checked that the latter two effects are not suitable for measuring currents insensitive to stray fields because:

- the magnetic field range where the rotation of the polarisation has a linear dependence on the magnetic field is very narrow: a few nT for NMOR resonance, and a few hundred nT for the Macaluso-Corbino effect, which significantly limits the possibility of measuring high currents using these resonances, and without using a compensation field that would result in a very high current consumption;
- these effects are not insensitive to the transverse magnetic fields such that the immunity to stray currents provided by the Ampere integral is lost.

Thus, within the scope of the invention, the optical beam provided by the optical source 2 is preferably shifted in wavelength (i.e. detuned) from the centre of an atomic transition line of the atomic gas.

The optimum detuning can be sought experimentally, but generally corresponds to half the full width at half maximum of the atomic line considered. For experimental research, the criterion applied involves obtaining a linear dependence of the rotation of the plane of polarisation of the light as a function of the magnetic field over the entire dynamic range of the field required for the measurement.

By exploiting this shift in wavelength from the centre of the atomic transition line by half the full width at half maximum of said line, the Applicant has experimentally demonstrated on the D0 and D2 lines of helium that a current measurement can be obtained that is independent (to better than one per thousand) of the presence or absence of stray magnetic fields originating from currents outside the light loop, from magnets, from the Earth's field or from materials with significant remanent magnetisation. It should be noted that the use of the $D_2$ transition, rather than the $D_0$ or $D_1$ transitions, is preferred, since it allows much more favourable signal-to-noise ratios to be obtained and does not include non-linear magneto-optic effects that can interfere with the measurement when the local field passes close to zero.

According to one possible embodiment of the invention, the sensor can further comprise a modulator modulating the wavelength of the optical beam provided by the light source and a light source servo-control system configured to maintain the shift in wavelength of the optical beam from the centre of the line. Since the absorption line is evenly symmetrical about an optical resonance frequency, if the modulation is performed with a $\sin(\omega t)$-type time dependence, a signal allowing the current to be measured is present in the $\cos(\omega t)$ component, whereas a signal representative of a laser shift from the optical resonance frequency is present in the residual $\sin(\omega t)$ component of the photodetection signal. Thus, this wavelength modulation allows a current measurement on the even symmetry of the signal to be combined with a measurement of the shift in wavelength relative to the odd-symmetric signals. This shift measurement can thus be used as an error signal for servo-control of a control parameter of the optical source (for example the pump current of a laser diode) in order to maintain perfect detuning between the wavelength of the optical beam and the atomic line considered.

According to another embodiment, the sensor can further comprise a modulator configured to modulate the amplitude or the frequency of the optical beam provided by the light source. The sensor can thus exploit the AM-NMOR or FM-NMOR effect (use of NMOR resonance in the presence of amplitude or frequency modulation of the optical beam). Each of these effects allows the independence from the transverse fields to be recovered, which is not possible with simple NMOR resonance. The advantage over the linear Faraday effect is a much more advantageous slope (100 times steeper), resulting in a more favourable signal-to-noise ratio. This embodiment is thus advantageous for measuring low currents (such as leakage currents) very accurately in order to carry out diagnostics, for example, regarding the ageing (or soiling) of structures that are expected to provide very good galvanic insulation.

It should be noted that wavelength modulation can be combined with AM-NMOR to obtain both wavelength servo-control and a measurement. Wavelength modulation can also be combined with FM-NMOR by combining two laser wavelength modulations: a first (FM-NMOR) tuned to the measured magnetic field and thus fast (several MHz in the Earth's field, for example), and the second for the servo-control of the laser, the frequency whereof can be freely chosen.

The invention is not limited to the sensor described hereinabove, but further extends to a method for measuring a current using such a sensor, in particular to a method for measuring a current flowing through a conductor, comprising the steps of:
providing a linearly-polarised optical beam using a light source,
causing said optical beam to flow along an optical path arranged between the light source and a polarisation analyser, said optical path forming a closed trajectory around the conductor and said optical beam passing through a cell containing an atomic gas as it flows along the optical path,
performing a differential measurement of two polarisation components of the optical beam that has travelled along the optical path using the polarisation analyser.

The invention claimed is:
1. A magneto-optical sensor for sensing a current flowing through a conductor, comprising:
an optical source comprising a light source, the optical source configured to provide a linearly-polarized optical beam,
a polarization analyzer configured to perform a differential measurement of two polarization components of the linearly-polarized optical beam having travelled along an optical path arranged between the light source and the polarization analyzer, said optical path forming a closed trajectory around the conductor,
wherein the magneto-optical sensor further comprises a cell containing an atomic gas arranged along the optical path, the atomic gas being present along an entirety of the closed trajectory of the optical beam on the optical path surrounding the conductor.

2. The magneto-optical sensor according to claim 1, wherein the optical beam provided by the optical source is shifted in wavelength from a center of an atomic transition line of the atomic gas.

3. The magneto-optical sensor according to claim 2, wherein the optical beam provided by the optical source is shifted in wavelength from a center of the atomic transition line by half the full width at half maximum of said line.

4. The magneto-optical sensor according to claim 2, wherein the atomic gas is helium-4 and said line is a D2 line.

5. The magneto-optical sensor according to claim 2, further comprising a modulator configured to modulate a wavelength of the optical beam provided by the optical source and a light source servo-control system configured to maintain the shift in wavelength of the optical beam from the center of said line.

6. The magneto-optical sensor according to claim 1, further comprising a modulator configured to modulate an amplitude or a frequency of the optical beam provided by the optical source.

7. The magneto-optical sensor according to claim 1, further comprising mirrors arranged along the optical path.

8. The magneto-optical sensor according to claim 7, wherein the cell is annular.

9. The magneto-optical sensor according to claim 1, wherein the polarization analyzer is a linear polarization analyzer configured to perform a differential measurement of a vertical polarization component and of a horizontal polarization component of the optical beam that has travelled along the optical path.

10. The magneto-optical sensor according to claim 9, wherein the linear polarization analyzer comprises a polarization splitter configured to split the vertical polarization component and the horizontal polarization component on a first and a second path, and a respective photodetector being arranged on each of the first and second paths.

11. The magneto-optical sensor according to claim 1, wherein the polarization analyzer is a circular polarization analyzer configured to perform a differential measurement of a right-hand circular polarization component and of a left-hand circular polarization component of the optical beam that has travelled along the optical path.

12. The magneto-optical sensor according to claim 11, wherein the circular polarization analyzer comprises a quarter-wave plate, a polarization splitter configured to split the right-hand circular polarization component and the left-hand circular polarization component on a first and a second path, and a respective photodetector arranged on each of the first and second paths.

13. A method for measuring a current flowing through a conductor, the method comprising:
providing a linearly-polarized optical beam using an optical source comprising a light source,
causing said optical beam to flow along an optical path arranged between the light source and a polarization analyzer, said optical path forming a closed trajectory around the conductor,
performing a differential measurement of two polarization components of the optical beam that has travelled along the optical path using the polarization analyzer, wherein said optical beam passes through a cell containing an atomic gas as the optical beam flows along the optical path, the atomic gas being present along an entirety of the closed trajectory of the optical beam on the optical path surrounding the conductor.

* * * * *